(12) United States Patent
Chien et al.

(10) Patent No.: US 9,000,412 B2
(45) Date of Patent: Apr. 7, 2015

(54) SWITCHING DEVICE AND OPERATING METHOD FOR THE SAME AND MEMORY ARRAY

(75) Inventors: Wei-Chih Chien, New Taipei (TW); Feng-Ming Lee, Fenyuan Township, Changhua County (TW); Ming-Hsiu Lee, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/561,558

(22) Filed: Jul. 30, 2012

(65) Prior Publication Data

US 2014/0027706 A1   Jan. 30, 2014

(51) Int. Cl.
*H01L 29/06* (2006.01)
*G11C 13/00* (2006.01)
*H01L 43/02* (2006.01)
*H01L 45/00* (2006.01)

(52) U.S. Cl.
CPC .......... *G11C 13/0002* (2013.01); *G11C 13/003* (2013.01); *H01L 43/02* (2013.01); *H01L 45/04* (2013.01); *H01L 45/06* (2013.01); *H01L 45/085* (2013.01); *H01L 45/1233* (2013.01); *H01L 45/1266* (2013.01); *H01L 45/145* (2013.01); *H01L 45/146* (2013.01)

(58) Field of Classification Search
USPC .................. 257/2–5, 9, 314, 438, E29.024, 257/E45.001; 365/100, 148, 163
See application file for complete search history.

(56) References Cited

U.S. PATENT DOCUMENTS

| | | | |
|---|---|---|---|
| 2008/0043515 A1* | 2/2008 | Bloch | 365/153 |
| 2009/0140232 A1 | 6/2009 | Ufert | |
| 2011/0033972 A1* | 2/2011 | Sydorenko et al. | 438/99 |
| 2011/0147690 A1* | 6/2011 | Yang | 257/2 |
| 2013/0001501 A1* | 1/2013 | Sills | 257/4 |
| 2013/0009128 A1* | 1/2013 | Ribeiro et al. | 257/9 |

OTHER PUBLICATIONS

TW Office Action dated Jan. 8, 2015.

* cited by examiner

*Primary Examiner* — Mark A Laurenzi
(74) *Attorney, Agent, or Firm* — McClure, Qualey & Rodack, LLP

(57) ABSTRACT

A switching device and an operating method for the same and a memory array are provided. The switching device comprises a first solid electrolyte, a second solid electrolyte and a switching layer. The switching layer is adjoined between the first solid electrolyte and the second solid electrolyte.

11 Claims, 4 Drawing Sheets

SWITCHING DEVICE AND OPERATING METHOD FOR THE SAME AND MEMORY ARRAY

BACKGROUND

1. Technical Field

The disclosure relates in general to a switching device and an operating method for the same and more particularly to a memory array having the switching device and an operating method for the same.

2. Description of the Related Art

Along with the advance in semiconductor technology, electronic elements are kept being miniaturized, such that electronic products possess more and more functions when the size remains unchanged or become even smaller. As there are more and more information to be processed, the demand for the memory having larger capacity but smaller size is ever increasing.

Currently, the read-write memory stores data by means of a transistor structure assisted by a memory cell. However, the technology for manufacturing such memory has come to a bottleneck in terms of scalability. Therefore, more advanced memory structures, such as phase change random access memory (PCRAM), magnetic random access memory (MRAM), and resistive random access memory (RRAM), are presented. The RRAM, having the advantages of fast read-write speed, non-destructive access, tolerance against extreme temperatures and compatibility with current manufacturing process of complementary metal oxide semiconductor (CMOS), is a new memory technology with great potential to replace the current storage media.

However, currently, as operating a memory array, there is still leakage problem and so on.

SUMMARY

A switching device is provided. The switching device comprises a first solid electrolyte, a second solid electrolyte and a switching layer. The switching layer is adjoined between the first solid electrolyte and the second solid electrolyte.

A memory array is provided. The memory array comprises memory cells. Each of the memory cells comprises a switching device and a memory device. The switching device includes a first solid electrolyte, a second solid electrolyte, and a switching layer. The switching layer is adjoined between the first solid electrolyte and the second solid electrolyte. The memory device has contact terminals. One of the first solid electrolyte and the second solid electrolyte is electrically connected to at least one of the contact terminals of the memory device.

An operating method for a switching device is provided. The switching device comprises a first solid electrolyte, a second solid electrolyte and a switching layer. The switching layer is adjoined between the first solid electrolyte and the second solid electrolyte. The method comprises following steps. A first bias is applied to the switching device to change the switching layer from conductivity break property into conductivity connection property. A second bias different from the first bias is applied to the switching device to change the switching layer from conductivity connection property into conductivity break property.

The above and other aspects of the disclosure will become better understood with regard to the following detailed description of the non-limiting embodiment(s). The following description is made with reference to the accompanying drawings.

DETAILED DESCRIPTION

Figure 1:
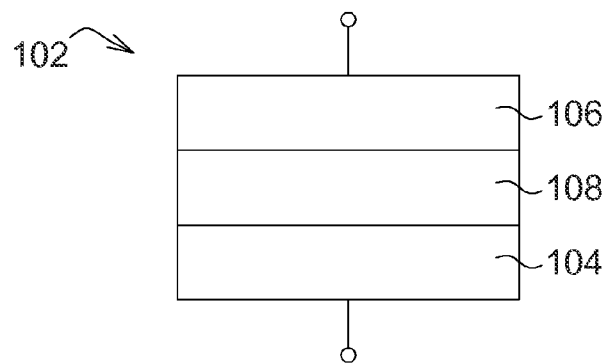
FIG. 1 illustrates a cross-section view of a switching device according to one embodiment.

FIG. 1 illustrates a cross-section view of a switching device 102 according to one embodiment. The switching device 102 comprises a first solid electrolyte 104, a second solid electrolyte 106 and a switching layer 108. The switching layer 108 is adjoined between the first solid electrolyte 104 and the second solid electrolyte 106. The first solid electrolyte 104 and the second solid electrolyte 106 are separated by the switching layer 108. Materials of the first solid electrolyte 104 and the second solid electrolyte 106 may respectively comprise metal containing chalcogenide, such as Cu containing or Ag containing chalcogenide. In one embodiment, the materials of the first solid electrolyte 104 and the second solid electrolyte 106 are Te—Cu alloy, respectively. However, the present disclosure is not limited thereto. In other embodiments, the first solid electrolyte 104 and the second solid electrolyte 106 may respectively comprise Te—Ag alloy, or other suitable materials. A material of the switching layer 108 may comprise a dielectric material such as a silicon oxide, a silicon nitride, a silicon oxynitride or other suitable dielectric materials.

The switching device 102 may be manufactured by a self-align process without using additional masks. Therefore, cost for manufacturing the switching device 102 is low.

Referring to FIG. 1, switching layer 108 has conductivity break property as no bias is applied to the switching device 102. In embodiments, the switching device 102 is used for switching on/off electron current path.

Figure 2A:
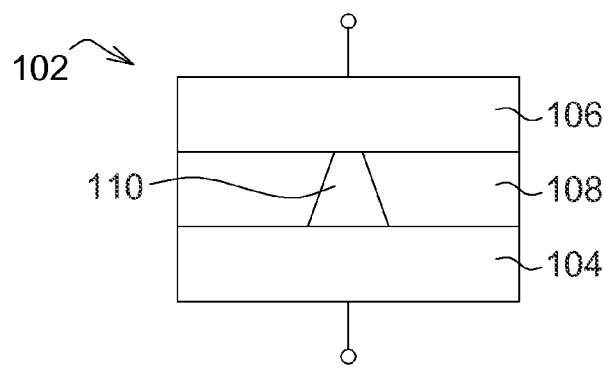
FIG. 2A illustrates a cross-section view of a switching device according to one embodiment.
Figure 2B:
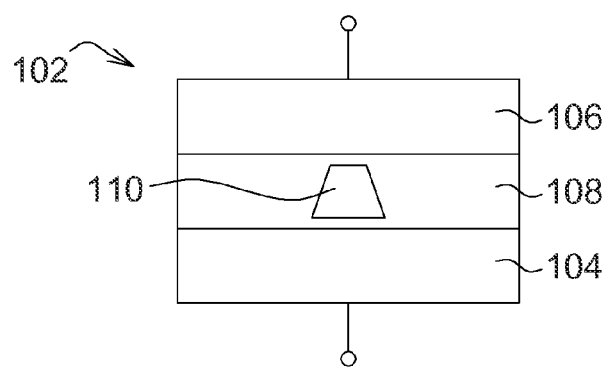
FIG. 2B illustrates a cross-section view of a switching device according to one embodiment.

FIG. 2A and FIG. 2B illustrate an operating method for the switching device 102 according to one embodiment. As shown in FIG. 2A, in one embodiment, a positive switching bias (electric field), substantially higher than 0V for example, is applied to the switching device 102, for example by grounding the first solid electrolyte 104 of the switching device 102 and applying a positive voltage to the second solid electrolyte 106 of the switching device 102, so as to move metal ions with positive charge from the second solid electrolyte 106 into the switching layer 108 and accumulate the metal ions between the first solid electrolyte 104 and the second solid electrolyte 106 to form a conductive bridge 110 adjoined between the first solid electrolyte 104 and the second solid electrolyte 106. Therefore, the switching layer 108 has conductivity connection property. In other words, electron current can pass between the first solid electrolyte 104 and the second solid electrolyte 106 through the conductive bridge 110 in the switching layer 108. In a case of the first solid electrolyte 104 and the second solid electrolyte 106 being Te—Cu alloy, the moving metal ions are Cu ions.

As shown in FIG. 2B, in one embodiment, after the positive switching bias for changing the switching layer 108 into conductivity connection property, for example by applying no voltage to the first solid electrolyte 104 and the second solid electrolyte 106, or by generating substantially zero electric field between the first solid electrolyte 104 and the second solid electrolyte, the metal ions in the conductive bridge 110 adjacent to the first solid electrolyte 104 and the second solid electrolyte 106 would be attracted by and moved towards the first solid electrolyte 104 and the second solid electrolyte 106. Therefore, the conductive bridge 110 is broken from the first solid electrolyte 104 and the second solid electrolyte 106, and the switching layer 108 becomes into conductivity break property. In other words, electron current can not pass through the first solid electrolyte 104 and the second solid electrolyte 106.

Figure 3A:
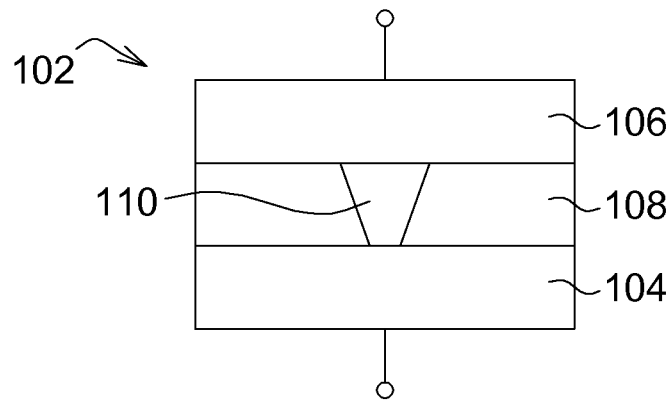
FIG. 3A illustrates a cross-section view of a switching device according to one embodiment.
Figure 3B:
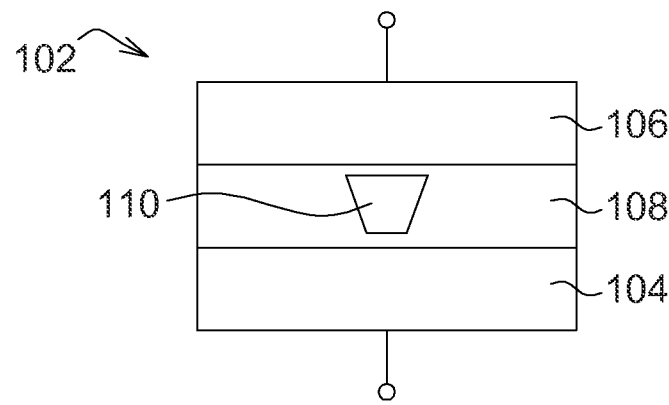
FIG. 3B illustrates a cross-section view of a switching device according to one embodiment.

FIG. 3A and FIG. 3B illustrate an operating method for the switching device 102 according to one embodiment. As shown in FIG. 3A, in one embodiment, a negative switching bias (electric field), substantially smaller than 0V for example, is applied to the switching device 102, for example by grounding the first solid electrolyte 104 of the switching device 102 and applying a negative voltage to the second solid electrolyte 106 of the switching device 102, so as to move metal ions with positive charge from the first solid electrolyte 104 into the switching layer 108 and accumulate the metal ions between the first solid electrolyte 104 and the second solid electrolyte 106 to form a conductive bridge 110 adjoined between the first solid electrolyte 104 and the second solid electrolyte 106. Therefore, the switching layer 108 has conductivity connection property. In other words, electron current can pass between the first solid electrolyte 104 and the second solid electrolyte 106 through the conductive bridge 110 in the switching layer 108. In a case of the first solid electrolyte 104 and the second solid electrolyte 106 being Te—Cu alloy, the moving metal ions are Cu ions.

As shown in FIG. 3B, in one embodiment, after the negative switching bias for changing the switching layer 108 into conductivity connection property, for example by applying no voltage to the first solid electrolyte 104 and the second solid electrolyte 106, or by generating substantially zero electric field between the first solid electrolyte 104 and the second solid electrolyte, the metal ions in the conductive bridge 110 adjacent to the first solid electrolyte 104 and the second solid electrolyte 106 would be attracted by and moved towards the first solid electrolyte 104 and the second solid electrolyte 106. Therefore, the conductive bridge 110 is broken from the first solid electrolyte 104 and the second solid electrolyte 106, and the switching layer 108 becomes into conductivity break property. In other words, electron current can not pass through the first solid electrolyte 104 and the second solid electrolyte 106.

The switching device 102 may be electrically connected to the memory device (not shown) and used for controlling the memory device on/off. For example, the switching device 102 is electrically connected to the memory device in series. In one embodiment, an operating method for a semiconductor device comprises programing, erasing and reading the memory device. In the steps for programing, erasing and reading, the switching device 102 may be used for turning on a selected memory device, while turning off an un-selected memory device for avoiding current leakage path.

In one embodiment, a positive programing bias Vp is applied to the memory device, which generates a positive switching bias Vs to the switching device 102 electrically connected to the memory device so that the switching layer 108 has conductivity connection property as shown in FIG. 2A. Next, the positive programing bias Vp is removed so that the switching layer 108 of switching device 102 has conductivity break property as shown in FIG. 2B while the memory device is maintained in programing state. Next, a positive reading bias Vr may be applied to the memory device to read the programing state of the memory device, which would generate a positive switching bias Vs to the switching device 102 electrically connected to the memory device so that the switching layer 108 has conductivity connection property as shown in FIG. 2A. In embodiments, relation among the programing bias Vp, the switching bias Vs and the reading bias Vr may be indicated as following equation.

$$2*Vs>Vp>Vr>Vs$$

In one embodiment, a negative erasing bias Ve is applied to the memory device, which generates a negative switching bias Vs to the switching device 102 electrically connected to the memory device so that the switching layer 108 has conductivity connection property as shown in FIG. 3A. Next, the negative erasing bias Ve is removed so that the switching layer 108 of the switching device 102 has conductivity break property as shown in FIG. 3B while the memory device is maintained in erasing state. Next, a positive reading bias Vr may be applied to the memory device to read the erasing state of the memory device, which would generate a positive switching bias Vs to the switching device 102 electrically connected to the memory device so that the switching layer 108 has conductivity connection property as shown in FIG. 2A. In embodiments, relation among the erasing bias Ve, the switching bias Vs and the reading bias Vr may be indicated as following equation.

$$2*|Vs|>|Ve|>Vr>|Vs|$$

Figure 4:
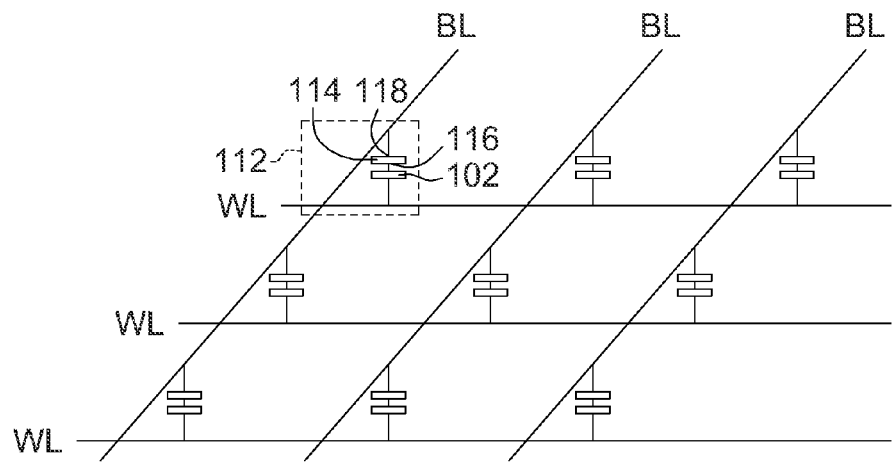
FIG. 4 illustrates a memory array according to one embodiment.
Figure 5:
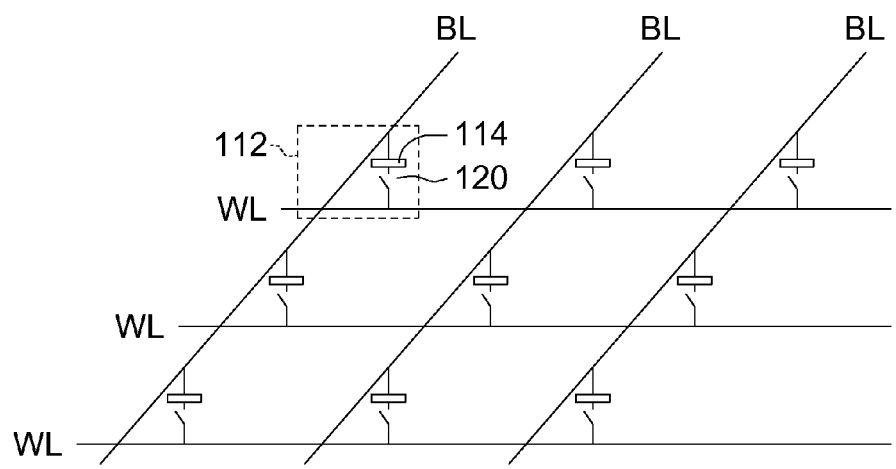
FIG. 5 illustrates a memory array according to one embodiment.

FIG. 4 illustrates a memory array according to one embodiment. The memory array is a cross-point array device. The memory array comprises memory cells 112. Each of the memory cells 112 comprises the switching device 102 and the memory device 114. The switching device 102 may be electrically connected to the memory device 114 in series. The switching device 102 may be similar with the switching device 102 as shown in FIG. 1. Referring to FIG. 4, in one embodiment, the memory device 114 has opposing first contact terminal 116 and second contact terminal 118. For example, the first contact terminal 116 of the memory device 114 may be electrically connected to the second solid electrolyte 106 (FIG. 1) of the switching device 102. The second contact terminal 118 of the memory device 114 may be electrically connected to bit line BL. The first solid electrolyte 104 (FIG. 1) of the switching device 102 may be electrically connected to word line WL. In embodiments, the switching device 102 is used for controlling the memory device 114 on/off, and may be indicated as an electron-current-path switching 120 as shown in FIG. 5.

Figure 6:
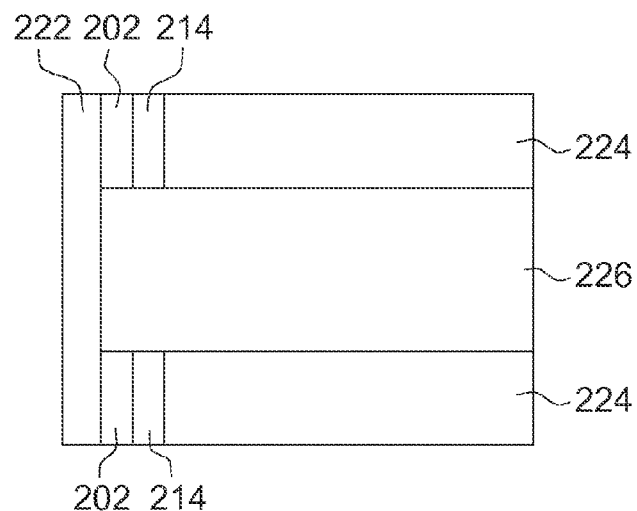
FIG. 6 illustrates a cross-section view of a memory structure according to one embodiment.

FIG. 6 illustrates a cross-section view of a memory structure according to one embodiment. The memory structure comprises the switching device 202 and the memory device 214 between the first electrode 222 and the second electrode 224. The switching devices 202 and the memory devices 214 of different levels are separated by a dielectric layer 226. The switching device 202 may be similar to the switching device 102 as shown in FIG. 1. The first electrode 222 and the second electrode 224 may comprise a metal such as W, TiN, etc. For example, the first electrode 222 is a top electrode, and the second electrode 224 is a bottom electrode. In one embodiment, the memory device 214 comprises a resistive memory. The memory device 214 comprises WOx. For example, the memory structure may have a sidewall structure, such as a single sidewall memory device 214.

Figure 7:
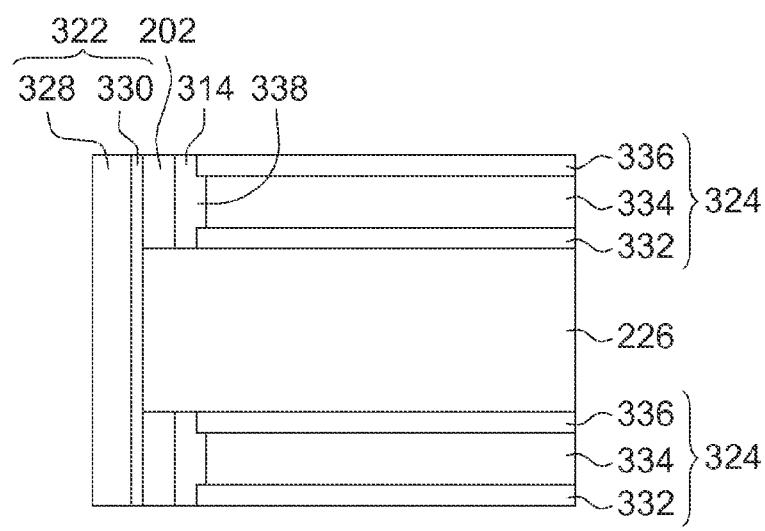
FIG. 7 illustrates a cross-section view of a memory structure according to one embodiment.

FIG. 7 illustrates a cross-section view of the memory structure according to one embodiment. The memory structure as shown in FIG. 7 is different from the memory structure as shown in FIG. 6 in that the first electrode 322 comprises a first sub electrode layer 328 and a second sub electrode layer 330. The second sub electrode layer 330 is between the first sub electrode layer 328 and the switching device 202. The second electrode 324 comprises a third sub electrode layer 332, a fourth sub electrode layer 334 and a fifth sub electrode layer 336. The fourth sub electrode layer 334 is between the third sub electrode layer 332 and the fifth sub electrode layer 336. The first sub electrode layer 328 and the second sub electrode layer 330 may use different materials. In one embodiment, for example, the first sub electrode layer 328 comprises W, and the second sub electrode layer 330 comprises TiN. The third sub electrode layer 332, the fourth sub electrode layer 334 and the fifth sub electrode layer 336 may use different materials. In one embodiment, for example, the fourth sub electrode layer 334 comprises W, and the third sub electrode layer 332 and the fifth sub electrode layer 336 comprise TiN. The memory device 314 may have a protruding portion 338 among the third sub electrode layer 332, the fourth sub electrode layer 334 and the fifth sub electrode layer 336.

In embodiments, the switching device may be applied for a ReRAM, a programmable metallization cell (PMC) ReRAM, a phase change memory (PCM), a magnetoresistive random access memory (MRAM) such as a spin transfer torque magnetoresistive random access memory (STT-MRAM). In embodiments, the switching device may be used for realizing a three dimensional ReRAM. It is easy to integrate the switching device with a bipolar ReRAM. The switching device is suitable for a cross-point array device.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory structure, comprising:
   a first electrode;
   a second electrode;
   a switching device;
   a memory device having a protruding portion protruding into the second electrode, the memory and the switching device being electrically connected between the first electrode and the second electrode;
   an another second electrode;
   an another switching device;
   an another memory device, the another memory and the another switching device being electrically connected between the first electrode and the another second electrode; and
   a dielectric layer separating the switching device, the memory device and the second electrode from the another switching device, the another memory device and the another second electrode.

2. The memory structure according to claim 1, wherein the first electrode is a common electrode electrically connected to the switching device and the another switching device.

3. The memory structure according to claim 1, wherein the first electrode comprises a first sub electrode layer and a second sub electrode layer adjoined to each other.

4. The memory structure according to claim 3, wherein the first sub electrode layer and the second sub electrode layer of the first electrode use different materials.

5. The memory structure according to claim 1, wherein the memory device has a surface connected to the second electrode and away from the switching device.

6. The memory structure according to claim 1, wherein the protruding portion of the memory device is away from the switching device.

7. The memory structure according to claim 1, wherein the second electrode comprises a third sub electrode layer, a fourth sub electrode layer and a fifth sub electrode layer adjoined with each other.

8. The memory structure according to claim 7, wherein the protruding portion of the memory device contacts with the third sub electrode layer, the fourth sub electrode layer and the fifth sub electrode layer of the second electrode.

9. The memory structure according to claim 7, wherein the protruding portion of the memory device has a surface contact with the fourth sub electrode layer of the second electrode and opposing sidewalls contact with the third sub electrode layer and the fifth sub electrode layer of the second electrode respectively.

10. The memory structure according to claim 7, wherein the protruding portion of the memory extended beyond the third sub electrode layer and the fifth sub electrode of the second electrode.

11. The memory structure according to claim 7, wherein the third sub electrode layer, the fourth sub electrode layer and the fifth sub electrode layer of the second electrode use different materials.

* * * * *